(12) United States Patent
Iwanaga

(10) Patent No.: US 11,694,875 B2
(45) Date of Patent: Jul. 4, 2023

(54) CHARGED PARTICLE BEAM DRAWING DEVICE AND METHOD OF CONTROLLING CHARGED PARTICLE BEAM DRAWING DEVICE

(71) Applicant: JEOL Ltd., Tokyo (JP)

(72) Inventor: Masakazu Iwanaga, Tokyo (JP)

(73) Assignee: JEOL Ltd., Tokyo (JP)

(*) Notice: Subject to any disclaimer, the term of this patent is extended or adjusted under 35 U.S.C. 154(b) by 56 days.

(21) Appl. No.: 17/400,580

(22) Filed: Aug. 12, 2021

(65) Prior Publication Data
US 2022/0051869 A1 Feb. 17, 2022

(30) Foreign Application Priority Data

Aug. 14, 2020 (JP) .............................. JP2020-136930

(51) Int. Cl.
*H01J 37/302* (2006.01)
*G06F 3/0482* (2013.01)
*G06F 3/04847* (2022.01)

(52) U.S. Cl.
CPC ........ *H01J 37/3026* (2013.01); *G06F 3/0482* (2013.01); *G06F 3/04847* (2013.01); *H01J 2237/30411* (2013.01); *H01J 2237/30483* (2013.01); *H01J 2237/31761* (2013.01)

(58) Field of Classification Search
CPC ...... H01J 37/3023; H01J 37/3026; G03F 7/16
See application file for complete search history.

(56) References Cited

U.S. PATENT DOCUMENTS

| | | | | |
|---|---|---|---|---|
| 5,917,579 A * | 6/1999 | Miyajima | ........... | H01J 37/3026 250/492.23 |
| 2013/0019220 A1* | 1/2013 | Maruyama | .......... | H01J 37/3174 716/126 |

FOREIGN PATENT DOCUMENTS

| JP | H06112113 A | 4/1994 |
|---|---|---|
| JP | H10135111 A | 5/1998 |
| JP | 201326245 A | 2/2013 |

OTHER PUBLICATIONS

Tescan Orsay Holding, Tescan Vega 3 SEM Manual, 165 pages, Sep. 20, 2015, Dartmouth Electron Microscope Facility, https://www.dartmouth.edu/emlab/docs/tescan_vega3_sem_manual.pdf (Year: 2015).*
Tescan Orsay Holding, Tescan Vega 3 SEM manual, 165 pages, Sep. 20, 2015, Dartmouth Electron Microscope Facility, https://www.dartmouth.edu/docs/tescan_vega3_sem_manual.pdf (Year: 2015).*
Tescan Orsay Holding, Tescan Vega 3 SEM Manual, 165 pages, Sep. 20, 2015, Dartmouth College—Electron Microscope Facility, https://www.dartmouth.edu/emlab/docs/tescan_vega3_sem_manual.pdf.
Office Action issued in JP2020136930 dated Aug. 23, 2022.

* cited by examiner

*Primary Examiner* — David E Smith
(74) *Attorney, Agent, or Firm* — The Webb Law Firm

(57) ABSTRACT

A charged particle beam drawing device includes: a storage unit that stores a pattern generation program for generating pattern data, the pattern generation program being a program in which an instruction for specifying a type of a figure and an instruction for specifying a regular arrangement of the figure are described; an execution unit that executes the pattern generation program stored in the storage unit; and a control unit that performs drawing control based on the pattern data generated by the executed pattern generation program.

3 Claims, 19 Drawing Sheets

CHARGED PARTICLE BEAM DRAWING DEVICE AND METHOD OF CONTROLLING CHARGED PARTICLE BEAM DRAWING DEVICE

CROSS-REFERENCE TO RELATED APPLICATION

This application claims priority to Japanese Patent Application No. 2020-136930 filed Aug. 14, 2020, the disclosure of which is hereby incorporated by reference in its entirety.

BACKGROUND OF THE INVENTION

Field of the Invention

The present invention relates to a charged particle beam drawing device and a method of controlling the charged particle beam drawing device.

Description of Related Art

A conventional charged particle beam drawing device is known in which a predetermined area of a material is irradiated with a charged particle beam based on pattern data stored in a storage unit so that a desired pattern is drawn on the material (e.g., JP-A-6-112113).

In such a conventional charged particle beam drawing device, figure data created by software such as CAD is converted into pattern data and stored in the storage unit. Depending on the figure data, this may require a huge amount of data for the pattern data, which may result in a problem that the pattern data occupies a larger space of a disk.

SUMMARY OF THE INVENTION

The invention can provide a charged particle beam drawing device and a method of controlling the charged particle beam drawing device that are capable of reducing the space that pattern data occupies in a disk.

According to a first aspect of the invention, there is provided a charged particle beam drawing device including:

a storage unit that stores a pattern generation program for generating pattern data, the pattern generation program being a program in which an instruction for specifying a type of a figure and an instruction for specifying a regular arrangement of the figure are described;

an execution unit that executes the pattern generation program stored in the storage unit; and a control unit that performs drawing control based on the pattern data generated by the executed pattern generation program.

According to a second aspect of the invention, there is provided a method of controlling a charged particle beam drawing device including:

a storage step of storing in a storage unit a pattern generation program for generating pattern data, the pattern generation program being a program in which an instruction for specifying a type of a figure and an instruction for specifying a regular arrangement of the figure are described;

an execution step of executing the pattern generation program stored in the storage unit; and a control step of performing drawing control based on the pattern data generated by the executed pattern generation program.

Figure 1:
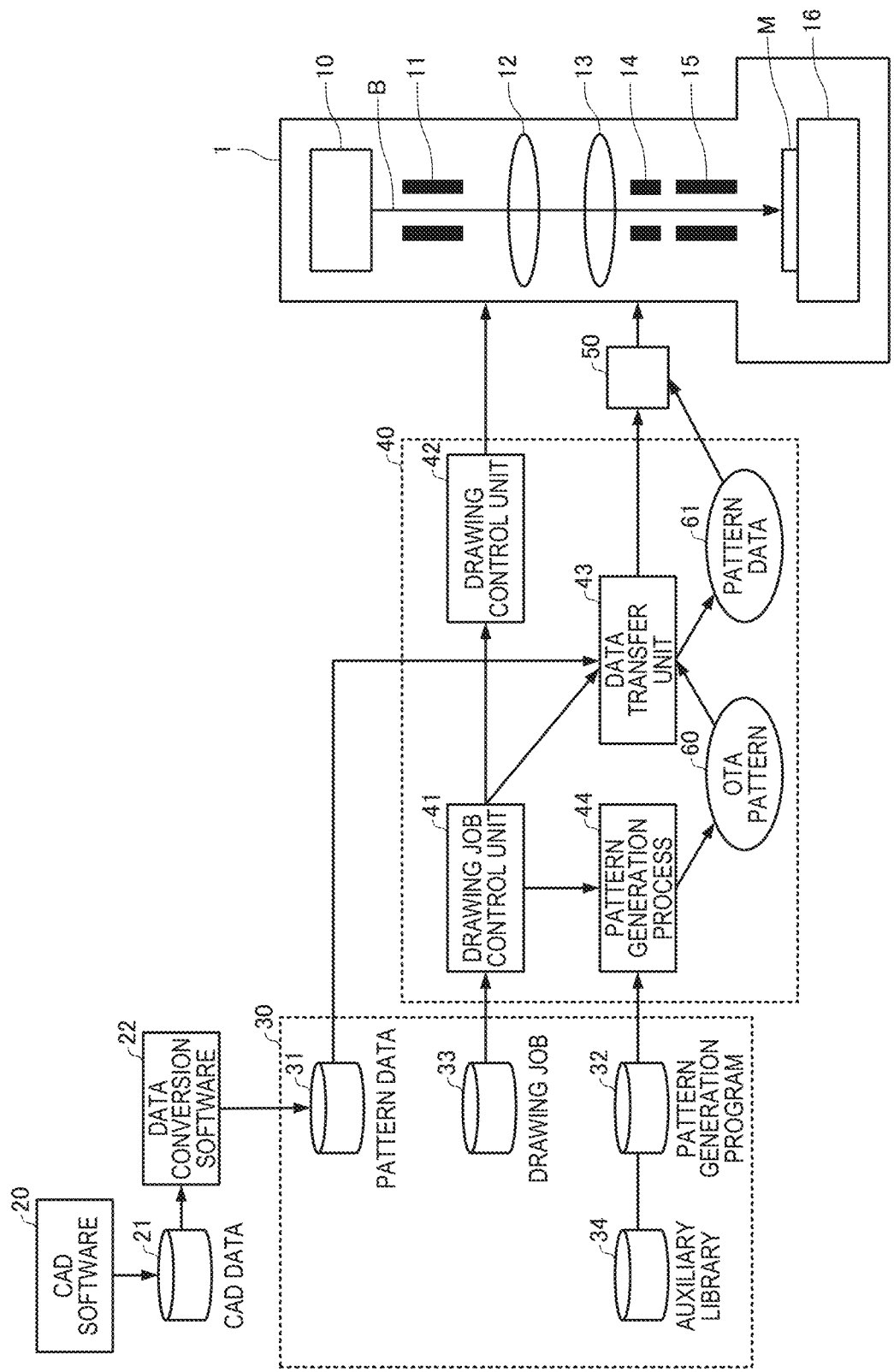
FIG. 1 is a diagram schematically illustrating an example of a configuration of an electron beam drawing device according to an embodiment of the invention.

DESCRIPTION OF THE INVENTION (1) A charged particle beam drawing device according to an embodiment of the invention includes:

a storage unit that stores a pattern generation program for generating pattern data, the pattern generation program being a program in which an instruction for specifying a type of a figure and an instruction for specifying a regular arrangement of the figure are described;

an execution unit that executes the pattern generation program stored in the storage unit; and a control unit that performs drawing control based on the pattern data generated by the executed pattern generation program.

Further, a method of controlling a charged particle beam drawing device according to an embodiment of the invention includes:

a storage step of storing in a storage unit a pattern generation program for generating pattern data, the pattern generation program being a program in which an instruction for specifying a type of a figure and an instruction for specifying a regular arrangement of the figure are described;

an execution step of executing the pattern generation program stored in the storage unit; and a control step of performing drawing control based on the pattern data generated by the executed pattern generation program.

According to the charged particle beam drawing device and the method of controlling the charged particle beam drawing device, by executing the pattern generation program, in which an instruction for specifying a type of a figure and an instruction for specifying a regular arrangement of the figure are described, to dynamically generate pattern data, the occupied space of a disk for the pattern data can be reduced.

(2) In the charged particle beam drawing device, the storage unit may store pattern data generated by converting figure data, and the control unit may perform drawing control based on the pattern data stored in the storage unit and the pattern data generated by the pattern generation program.

In the method of controlling the charged particle beam drawing device, the storage step may store pattern data generated by converting figure data, and the control step may perform drawing control based on the pattern data stored in the storage unit and the pattern data generated by the pattern generation program.

(3) The charged particle beam drawing device may further include:

a display control unit that displays on a display unit a plurality of options of basic elements that define the type of the figure and a plurality of options of structural elements that define the regular arrangement of the figure;

an operation reception unit that receives a user operation for making selection from among the basic elements and the structural elements to combine the selected basic and structural elements; and a program creation unit that creates the pattern generation program based on a combination of the basic elements and the structural elements selected in the operation.

The method of controlling the charged particle beam drawing device may further include:

a display control step of displaying on a display unit a plurality of options of basic elements that define the type of the figure and a plurality of options of structural elements that define the regular arrangement of the figure;

an operation reception step of receiving a user operation for making selection from among the basic elements and the structural elements to combine the selected basic and structural elements; and a program creation step of creating the pattern generation program based on a combination of the basic elements and the structural elements selected in the operation.

According to the charged particle beam drawing device and the method of controlling the charged particle beam drawing device, it is possible to create the pattern generation program through an intuitive and easy-to-understand operation of selecting a basic element and a structural element to combine the selected basic and structural elements, and thus to improve user convenience.

Preferred embodiments of the invention will be described in detail below with reference to the drawings. Note that the embodiments described below do not unduly limit the scope of the invention as stated in the claims. In addition, all of the components described in the following embodiments are not necessarily essential requirements of the invention.

FIG. 1 is a diagram illustrating a configuration of an electron beam drawing device (an example of a charged particle beam drawing device) according to an embodiment of the invention. Note that the electron beam drawing device according to the present embodiment may have a configuration in which some or part of the components (respective units) in FIG. 1 are omitted.

The electron beam drawing device includes an electron beam drawing device main body 1, a storage unit 30, a control device 40 (an execution unit and a control unit), and a data processing device 50. The electron beam drawing device main body 1 includes an electron gun 10 that generates an electron beam B, a blanker 11 that blanks the electron beam B, an irradiation lens system 12, an objective lens 13, a sub deflector 14, a main deflector 15, and a stage 16 on which a drawing material M (chip, etc.) is placed. The electron beam B generated from the electron gun 10 travels through the irradiation lens system 12 and the objective lens 13 so that the drawing material M is irradiated with the electron beam B. By moving the stage 16 and controlling the sub deflector 14 and the main deflector 15, the irradiation position on the drawing material M can be changed.

The storage unit 30 stores pattern data 31, a pattern generation program 32, and a drawing job 33. The pattern data 31 is data obtained by converting CAD data 21 (figure data) created by CAD software 20 with data conversion software 22. The pattern generation program 32 is a program in which an instruction for specifying a type of a figure and an instruction for specifying a regular arrangement of figures (arrangement according to a given algorithm) are described, and outputs pattern data 60 in the OTA format, which will be described later. The pattern generation program 32 can be created by a user using an editor described later. The programming language used to create the pattern generation program 32 may be of any type as long as it is available on the control device 40 (computer). In a case where a major programming language such as the Python language is used, the storage unit 30 stores an auxiliary library 34 to facilitate programming. The drawing job 33 is data in which conditions such as arrangement (layout) of a drawing pattern on the drawing material M and device calibration are specified, and is created by the user. In the drawing job 33, the pattern data 31 and the start command of the pattern generation program 32 are specified as a drawing pattern.

The control device 40 performs processing of controlling the electron beam drawing device main body 1. The function(s) of the control device 40 can be implemented by hardware such as various types of processors, or a program or programs. The control device 40 includes a drawing job control unit 41, a drawing control unit 42, and a data transfer unit 43. The drawing job control unit 41 refers to the drawing job 33 to perform drawing control (e.g., a control to move the stage 16 to the position of a drawing target field, a control to draw pattern data for the drawing target field, and processing such as device calibration) in cooperation with the drawing control unit 42 and the data transfer unit 43. The drawing job control unit 41 transmits the pattern data 31 specified by the drawing job 33 to the data transfer unit 43, and also executes the pattern generation program 32 based on the start command specified by the drawing job 33 to create (start) the pattern generation process 44. The pattern generation process 44 outputs the pattern data 60 in the drawing order. The output of the pattern generation process 44 is transmitted to the data transfer unit 43 through the FIFO function of the OS (operating system). The data transfer unit 43 transmits the pattern data 31 to the data processing device 50, converts the pattern data 60 into the device-specific pattern data 61, transmits the resulting data to the data processing device 50, and controls the sub deflector 14, the main deflector 15, and the like via the data processing device 50 based on a control signal from the drawing job control unit 41. The drawing control unit 42 performs a control to move the stage 16, processing for setting parameters related to the sub deflector 14 and the main deflector 15, and the like, based on a control signal from the drawing job control unit 41.

Further, the control device 40 may further include a display control unit that displays a screen of an editor for creating the pattern generation program 32 on a display unit (display), an operation reception unit that receives user operations through the editor, and a program generation unit that generates the pattern generation program 32 based on a user operation received through the editor.

Figure 2:
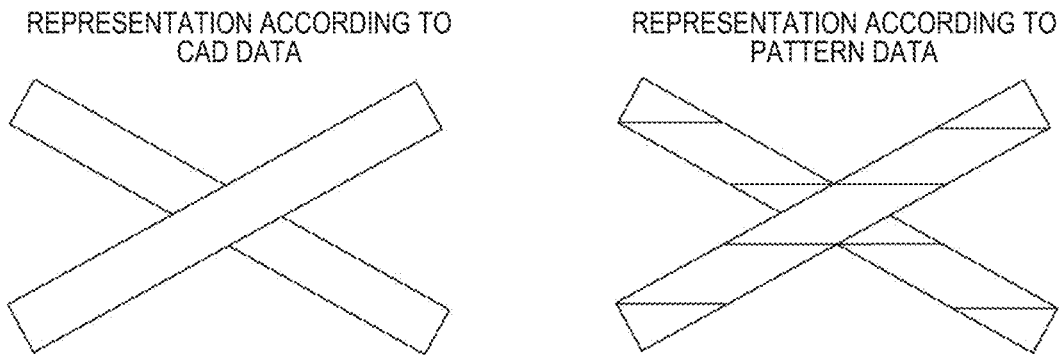
FIG. 2 illustrates the representation of figures according to CAD data and pattern data.

FIG. 2 illustrates the representation of figures according to CAD data (21) and pattern data (31). Both the CAD data and the pattern data represent figures, but for the CAD data, various representations such as polygons and circles can be used. In addition, for the CAD data, overlapping of figures is not taken into consideration, and its final shape is set as a figure to be drawn. On the other hand, for the pattern data, figures are represented only by rectangles and trapezoids having sides parallel to the x-axis and y-axis in an xy-Cartesian coordinate system, and each figure directly involves the irradiation range of an electron beam, so that overlapping of the figures is removed. As illustrated in FIG. 2, for the CAD data, a figure is represented as being two rectangles intersecting diagonally, whereas for the pattern data, a figure is represented as being subdivided into 11 trapezoids.

The main deflector 15 and the sub deflector 14 are used to irradiate the drawing material M with the electron beam B, but there is a limit on the range of angles at which each deflector can deflect the beam. The beam irradiation range of the main deflector 15 is called a field, and the beam irradiation range of the sub deflector 14 is called a subfield. The pattern data is composed of a combination of the position of a field and figure data in the field whose origin is the upper left of the field.

Figure 3:
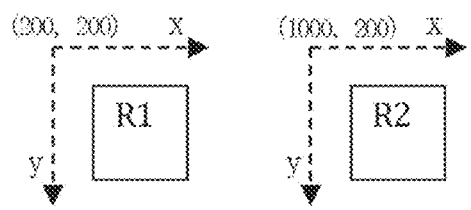
FIG. 3 illustrates an example of pattern data including two rectangles.

FIG. 3 illustrates an example of pattern data including two rectangles R1 and R2. The pattern data is represented by an xy-coordinate system with an x-axis whose right side in the horizontal direction is positive and a y-axis whose lower side in the vertical direction is positive. The rectangle R1 is located in the field whose origin is (200, 200), and the rectangle R2 is located in the field whose origin is (1000, 200).

Figure 4:
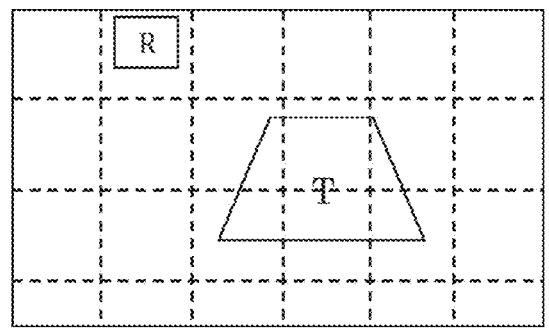
FIG. 4 illustrates an example of the arrangement of figures and subfields in a field.

The figure in the field is further subdivided into subfields, and the figure is drawn in units of subfields. FIG. 4 illustrates an example of the arrangement of figures and subfields in a field. In FIG. 4, the boundaries of the subfields are indicated by a dashed grid. Basically, the position of each subfield is set by a grid with equal intervals from the origin of the field, and for figure data over a plurality of subfields, a drawing system divides it by the subfield boundaries to draw the resulting figure for each subfield in a group manner. A rectangle R in FIG. 4 is contained within the subfield, while a trapezoid T are over six subfields. Thus, the trapezoid T is divided into six figures by the subfield boundaries and drawn.

For the pattern data, there is a virtual coordinate system called "position set area", and its origin can be specified as an offset from the origin of the field by a command called "position set command". The position of the figure data is an offset from the origin of the latest position set area. The position of the figure data on the field is defined by the sum of the origin position of the position set area and the position of the figure data on the position set area, and the coordinates are used for placement in the subfield. In this way, the position set command is basically irrelevant to the position of a subfield, but a function that regards the position specified by the position set command as the origin of the subfield is added as an option.

The pattern data is stored in a storage (storage unit 30) such as a hard disk in a binary format, but, for convenience, a part of the pattern data is represented herein in a text format.

Figure 5:
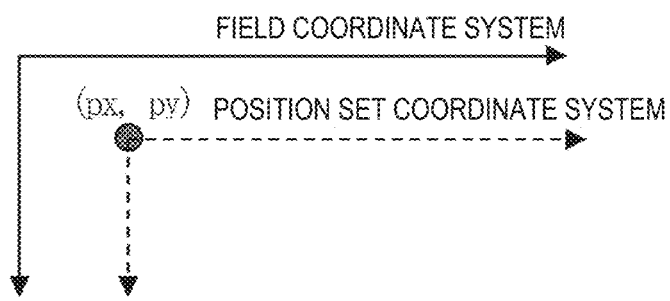
FIG. 5 is a diagram for explaining the specification of a position for position set in pattern data.
Figure 6:
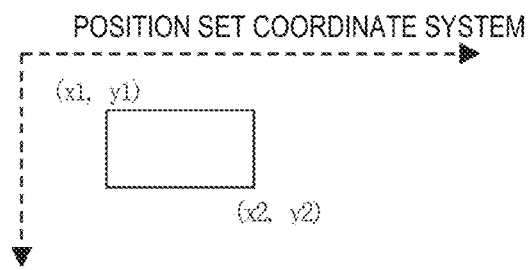
FIG. 6 is a diagram for explaining the specification of a rectangular figure in the pattern data.

The position of a field is specified by an offset (fx, fy) from the upper left of the drawing material M as follows.
FLD fx fy The position set position (the origin of the position set area) is specified by coordinates (px, py) in a field coordinate system as follows (see FIG. 5).
PSET px py A figure of rectangle is specified by the coordinates (x1, y1) and (x2, y2) of two diagonal points of the rectangle in a position set area coordinate system as follows (see FIG. 6).
RECT x1 y1 x2 y2

Figure 7:
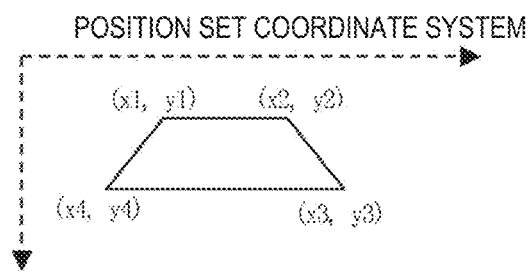
FIG. 7 is a diagram for explaining the specification of an x-trapezoid figure in pattern data.

An x-trapezoid (a trapezoid whose upper and lower bases are parallel to the x-axis) is defined by four points (x1, y1) to (x4, y4) to be specified as illustrated in FIG. 7 in the position set area coordinate system as follows.
TRAPX x1 y1 x2 x3 x4 y4

Figure 8:
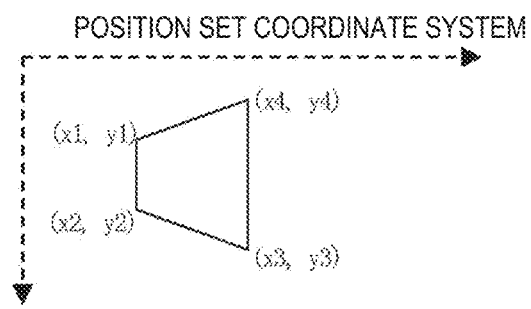
FIG. 8 is a diagram for explaining the specification of a y-trapezoid figure in pattern data.

A y-trapezoid (a trapezoid whose upper and lower bases are parallel to the y-axis) is defined by four points (x1, y1) to (x4, y4) to be specified as illustrated in FIG. 8 in the position set area coordinate system as follows.
TRAPY x1 y1 y2 y3 x4 y4

The figure specified by the pattern data is generally drawn as follows. (1) The stage 16 is moved to move the field center position (obtained from the position and size of the field) to a position directly below the beam. (2) All figure data in the field is placed in the subfields. For a figure over a plurality of subfields, it is placed in a subfield to which the upper left point of the figure belongs. (3) The subfield(s) in which the figure is placed is scanned in accordance with an instruction in which device parameters are specified, and the following (4) and (5) are performed for each subfield. Note that, as the scanning method, several types of scanning methods are defined, such as a method of zigzag scanning in the horizontal direction from the upper left, a method of raster scanning in the vertical direction, and a method of scanning without sorting (maintaining the order of appearance of figures). (4) The main deflector 15 is controlled so that the beam is deflected to the center position of the subfield in which the figure is placed. (5) All figures in the subfields are sequentially taken out in accordance with an instruction in which device parameters are specified, and for each figure, the inside of the figure is scanned. Scanning the inside of the figure is performed by controlling the sub deflector 14. Note that, for a figure over a plurality of subfields, the subfield to be scanned is temporarily switched.

Figure 9:
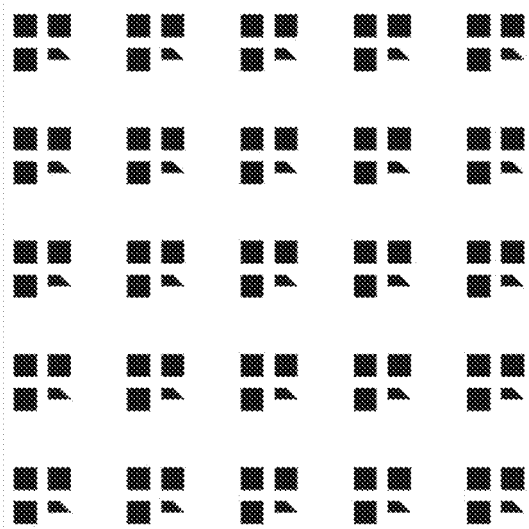
FIG. 9 illustrates an example of figure groups in which figures are regularly arranged.

The pattern data has a function of compacting figure commands for regularly arranged figures. For example, as illustrated in FIG. 9, in a case where groups of figures in which each group is composed of three rectangles and one trapezoid are arranged at equal intervals in 5 rows and 5 columns in the x and y directions, the groups can be represented by four figure commands along with a compacted command (COMP command) as follows, instead of 100 (4×5×5) figure commands.

COMP 4 5 5 1000 1000
RECT 0 0 200 200
RECT 0 300 200 500
RECT 300 0 500 200
TRAPX 300 300 400 500 300 400

Here, the parameters for the COMP command are the number of figures to be expanded in an array (4), the number of expansions in the x direction (5), the number of expansions in the y direction (5), the pitch in the x direction (1000), and the pitch in the y direction (1000).

In some cases where an experimental or prototype pattern in the field of nano-processing, a simple grid-like arrangement is performed and further, for example, the shot time (shot rank) is changed according to the arrangement position to be expanded.

Figure 10:
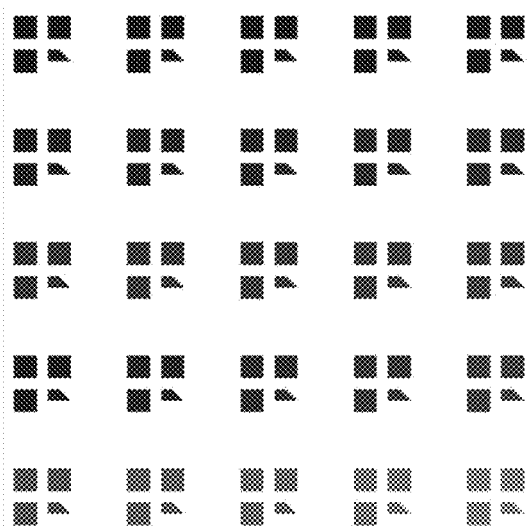
FIG. 10 illustrates an example of figure groups in which figures are regularly arranged.

FIG. 10 is a diagram illustrating an example in which the shot time (shot rank) is changed for each arrangement position of the figure groups of FIG. 9. In this example, the shot rank for each figure group is changed in 15 steps in the x direction and 90 steps in the y direction. In FIG. 10, the difference in shot time is represented by the difference in brightness. The shot time can be specified using a shot rank command (SRA command), but in such a case, the compact function for pattern data cannot be used, and a total of 125 commands are lined up as follows.

SRA 0
RECT 0 0 200 200
RECT 0 300 200 500
RECT 300 0 500 200
TRAPX 300 300 400 500 300 400
SRA 90
RECT 0 1000 200 1200
RECT 0 1300 200 1500
RECT 300 1000 500 1200
TRAPX 300 1300 400 500 300 1400
SRA 180
. . . (the rest is omitted)

Figure 11:
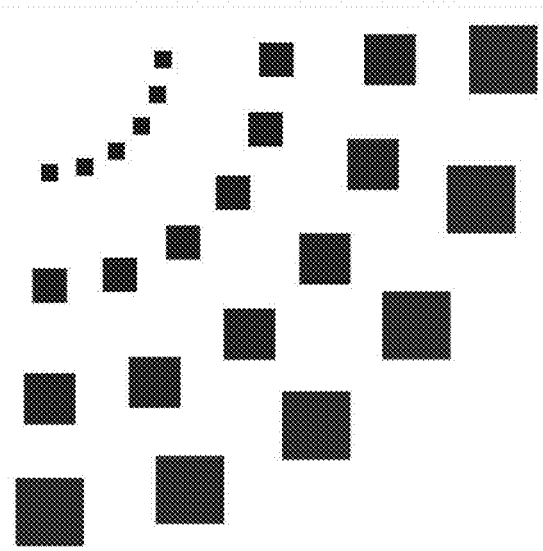
FIG. 11 illustrates an example of a figure group in which figures are regularly arranged.

An example illustrated in FIG. 11 is a pattern in which the center positions of rectangles are arranged with a radius of 1000 to 4000 in increments of 1000, an angle of 0 degrees to 90 degrees in increments of 18 degrees, and a rectangle size of 150 to 600 in increments of 150, and the shot rank is changed in the radial direction from 60 to 150 in steps of 30. In this way, even algorithmically regular pattern data cannot be compacted. For this pattern data, commands are lined up as follows.

SRA 60
RECT 1425 425 1575 575
RECT 1376 734 1526 884
RECT 1234 1013 1384 1163
RECT 1013 1234 1163 1384
RECT 734 1376 884 1526
RECT 425 1425 575 1575
SRA 90
RECT 2350 350 2650 650
RECT 2252 968 2552 1268
RECT 1968 1526 2268 1826
RECT 1526 1968 1826 2268
RECT 968 2252 1268 2552
RECT 350 2350 650 2650
SRA 120
RECT 3275 275 3725 725
RECT 3128 1202 3578 1652
RECT 2702 2038 3152 2488
RECT 2038 2702 2488 3152
RECT 1202 3128 1652 3578
RECT 275 3275 725 3725
SRA 150
RECT 4200 200 4800 800
RECT 4004 1436 4604 2036
RECT 3436 2551 4036 3151
RECT 2551 3436 3151 4036
RECT 1436 4004 2036 4604
RECT 200 4200 800 4800

Figure 12:
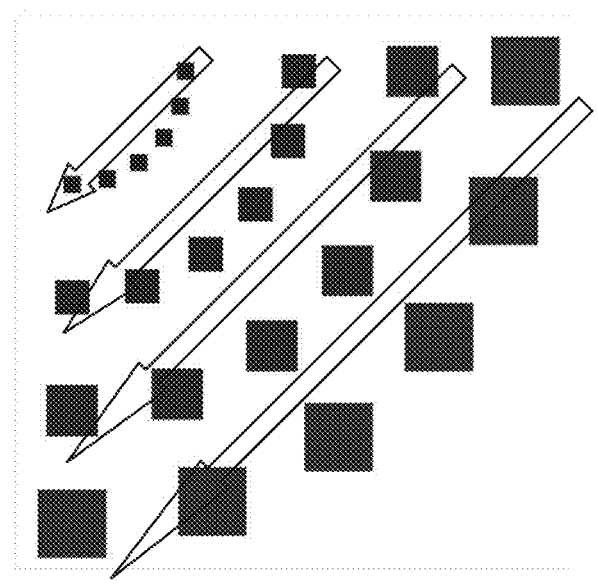
FIG. 12 is a diagram for explaining the drawing order of the figures.
Figure 13:
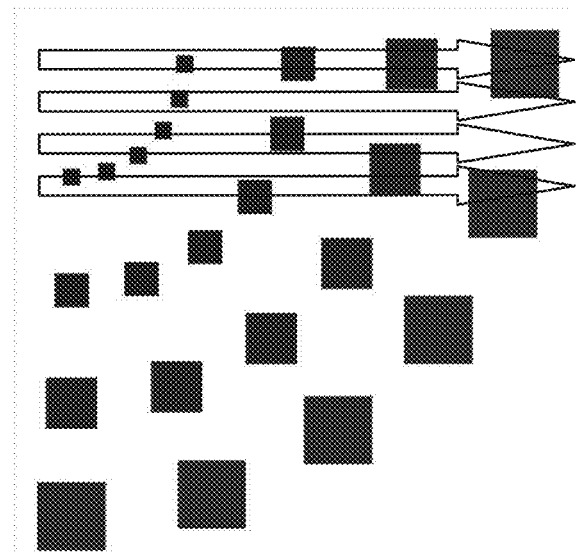
FIG. 13 is a diagram for explaining the drawing order of the figures.

In the above pattern data, the figure commands are arranged from the upper right to the lower left in order from the smallest radius (see FIG. 12), and the order of drawing the figures is ideal (theoretical) as intended by a user (e.g., designer of the prototype device). However, typically, when CAD data is converted into pattern data by the data conversion software 22, as illustrated in FIG. 13, the figures are sorted in a raster or zigzag order in parallel to the x-axis and the y-axis, which results in failure to draw the figures in the drawing order as intended by the user.

Figure 14:
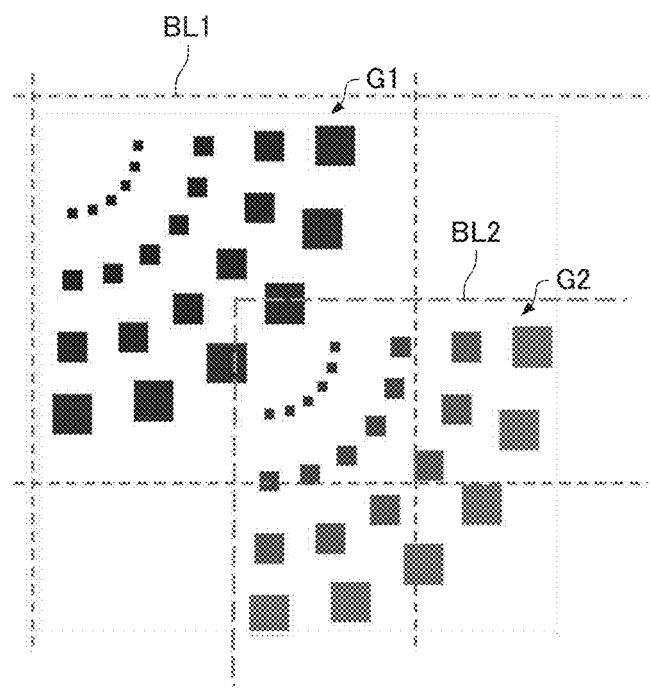
FIG. 14 illustrates an example in which figure groups are arranged over a plurality of subfields.

FIG. 14 illustrates an example in which figure groups each of which is that of FIG. 11 are arranged diagonally apart, and it is assumed that each figure group has a size to be contained in one subfield but both figure groups are not contained in the same subfield. In FIG. 14, broken lines BL1 indicate subfield boundaries. In this example, a figure group G1 is contained in a subfield, and a figure group G2 is not contained in a subfield. In such a case, when the CAD data is converted into pattern data by the data conversion software 22, the information indicating the unity of the figure group is lost, so that the figure group G1 and part of the figure group G2 are drawn in the same subfield while the rest of the figure group G2 is separated into three subfields. This is not desirable because, for the field of nano-processing devices, it is required to draw the same type of group of figures under the same quality as possible. Note that, although it is possible to draw the figure group G2 in an independent subfield (the area surrounded by broken lines BL2 in FIG. 14) by enabling the option of position set command for setting the origin of the subfield, it is extremely difficult to recognize the respective figure groups and generate an appropriate position set command for each figure group.

Figure 15:
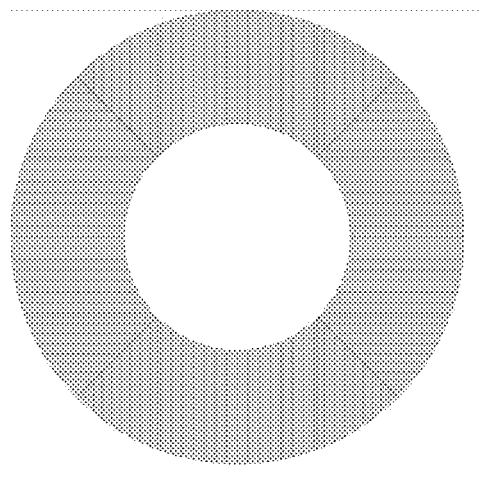
FIG. 15 illustrates an example of a donut-shaped pattern represented by trapezoids.

FIG. 15 illustrates an example of a donut-shaped pattern represented by x- and y-trapezoids. In this example, figures are combined so as to have symmetry as much as possible. However, in general, when CAD data is converted into pattern data by the data conversion software 22, the CAD data is often divided into slices in the x-direction or the y-direction by the computational geometry algorithm used by the data conversion software 22, so that the converted pattern cannot be expected to have the symmetry as in the example of FIG. 15.

The electron beam drawing device according to the present embodiment draws a pattern by using pattern data generated by the pattern generation program being executed, so as to solve the problems in using pattern data into which CAD data is converted (including the problem that pattern data cannot be compacted and as a result, the occupied space of the disk increases, and the problem that the order of drawing figures, the placement of a figure group in a subfield, and the composition of figures cannot be as intended by the user).

Hereinafter, a description example of a pattern generation program in Python language will be taken as an example. The following description example 1 is an example of a pattern generation program that generates pattern data for drawing the pattern of FIG. 10.

Description Example 1

```
import fig
import math
DIV=5
def draw_fig(dsg):
    dsg.rect(0, 0, 200, 200) # Rectangle output
    dsg.rect(0, 300, 200, 200) # Rectangle output
    dsg.rect(300, 0, 200, 200) # Rectangle output
    dsg.trapx(300, 300, 400, 500, 300, 400) # Trapezoid output
dsg=fig.OTADesigner( )
dsg.subfield(0, 0)
for x in range(5): # Repeat 5 times in x-axis direction
    for y in range(5): # Repeat 5 times in y-axis direction
        (y-axis side changes first: draw vertically)
        with dsg(fig.CadCoordinate(1000*x, 1000*y)): # Set virtual coordinate system dsg.shotrank(90*y+x*15) # Specify shot time based on x, y arrangement draw_fig(dsg)
dsg.end( )
```

Here, the "import fig" at the beginning means the use of an auxiliary library for the Python language. When this program is executed, the following pattern data (60) in the OTA format is output. The OTA format is a specification imposed on the output of the pattern generation program, and the field position, position set area position, rectangle, trapezoid, and the like are defined in a format using readable text. These are based on the above-mentioned representation of the pattern data represented in text format for convenience.

SRA 0
RECT 0 0 200 200
RECT 0 300 200 500
RECT 300 0 500 200
TRAPX 300 300 400 500 300 400
SRA 90
RECT 0 1000 200 1200
RECT 0 1300 200 1500
RECT 300 1000 500 1200
TRAPX 300 1300 400 500 300 1400
SRA 180
RECT 0 2000 200 2200
RECT 0 2300 200 2500
RECT 300 2000 500 2200
TRAPX 300 2300 400 500 300 2400
SRA 270
RECT 0 3000 200 3200
RECT 0 3300 200 3500
RECT 300 3000 500 3200
TRAPX 300 3300 400 500 300 3400
SRA 360
RECT 0 4000 200 4200
RECT 0 4300 200 4500
RECT 300 4000 500 4200
TRAPX 300 4300 400 500 300 4400
SRA 15
RECT 1000 0 1200 200
RECT 1000 300 1200 500
RECT 1300 0 1500 200
TRAPX 1300 300 1400 1500 1300 400
SRA 105
RECT 1000 1000 1200 1200
RECT 1000 1300 1200 1500
RECT 1300 1000 1500 1200
TRAPX 1300 1300 1400 1500 1300 1400
SRA 195
RECT 1000 2000 1200 2200
RECT 1000 2300 1200 2500
RECT 1300 2000 1500 2200
TRAPX 1300 2300 1400 1500 1300 2400
SRA 285
RECT 1000 3000 1200 3200
RECT 1000 3300 1200 3500
RECT 1300 3000 1500 3200
TRAPX 1300 3300 1400 1500 1300 3400
SRA 375
RECT 1000 4000 1200 4200
RECT 1000 4300 1200 4500
RECT 1300 4000 1500 4200
TRAPX 1300 4300 1400 1500 1300 4400
SRA 30
RECT 2000 0 2200 200
RECT 2000 300 2200 500
RECT 2300 0 2500 200
TRAPX 2300 300 2400 2500 2300 400
SRA 120
RECT 2000 1000 2200 1200
RECT 2000 1300 2200 1500
RECT 2300 1000 2500 1200
TRAPX 2300 1300 2400 2500 2300 1400
SRA 210
RECT 2000 2000 2200 2200
RECT 2000 2300 2200 2500
RECT 2300 2000 2500 2200
TRAPX 2300 2300 2400 2500 2300 2400
SRA 300
RECT 2000 3000 2200 3200
RECT 2000 3300 2200 3500
RECT 2300 3000 2500 3200
TRAPX 2300 3300 2400 2500 2300 3400
SRA 390
RECT 2000 4000 2200 4200
RECT 2000 4300 2200 4500
RECT 2300 4000 2500 4200
TRAPX 2300 4300 2400 2500 2300 4400
SRA 45
RECT 3000 0 3200 200
RECT 3000 300 3200 500
RECT 3300 0 3500 200
TRAPX 3300 300 3400 3500 3300 400
SRA 135
RECT 3000 1000 3200 1200
RECT 3000 1300 3200 1500
RECT 3300 1000 3500 1200
TRAPX 3300 1300 3400 3500 3300 1400
SRA 225
RECT 3000 2000 3200 2200
RECT 3000 2300 3200 2500
RECT 3300 2000 3500 2200
TRAPX 3300 2300 3400 3500 3300 2400

SRA 315
RECT 3000 3000 3200 3200
RECT 3000 3300 3200 3500
RECT 3300 3000 3500 3200
TRAPX 3300 3300 3400 3500 3300 3400
SRA 405
RECT 3000 4000 3200 4200
RECT 3000 4300 3200 4500
RECT 3300 4000 3500 4200
TRAPX 3300 4300 3400 3500 3300 4400
SRA 60
RECT 4000 0 4200 200
RECT 4000 300 4200 500
RECT 4300 0 4500 200
TRAPX 4300 300 4400 4500 4300 400
SRA 150
RECT 4000 1000 4200 1200
RECT 4000 1300 4200 1500
RECT 4300 1000 4500 1200
TRAPX 4300 1300 4400 4500 4300 1400
SRA 240
RECT 4000 2000 4200 2200
RECT 4000 2300 4200 2500
RECT 4300 2000 4500 2200
TRAPX 4300 2300 4400 4500 4300 2400
SRA 330
RECT 4000 3000 4200 3200
RECT 4000 3300 4200 3500
RECT 4300 3000 4500 3200
TRAPX 4300 3300 4400 4500 4300 3400
SRA 420
RECT 4000 4000 4200 4200
RECT 4000 4300 4200 4500
RECT 4300 4000 4500 4200
TRAPX 4300 4300 4400 4500 4300 4400

Such pattern data is converted into device-specific pattern data by the data transfer unit 43, and the resulting data is supplied to the data processing device 50, in which groups of figures having different shot times depending on the arrangement position are drawn as illustrated in FIG. 10.

The following description example 2 is an example of a pattern generation program that generates pattern data for drawing the pattern of FIG. 11.

Description Example 2 import fig
import math
DIV=5
def draw_fig(dsg, base_rank):
  def draw_rects(dsg, rad, size):
    for i in range (DIV+1): # Repeat downward from x-axis in 18 degree increments angle=(math.pi/(2*DIV))*i
      dsg.rect(rad, -angle, size, size, ref=fig.Refpos.C) # Rectangle output; rad, -angle are polar positions.
    for i in range(1, 5): # Repeat from inside to outside radius
      dsg.shotrank(base_rank+(i+1)*30) # Change shot rank according to radius
      draw_rects(dsg, 1000*i, 150*i)
dsg=fig.OTADesigner( )
dsg.subfield(0, 0)
with dsg(fig.PolarCoordinate(500, 500)):
  draw_fig(dsg, 0)
dsg.end( )

Here, "fig.PolarCoordinate(500, 500)" in the third line from the last means a specification of polar coordinates. In this example, the figures are drawn in the order illustrated in FIG. 12 by combining the two for statements. When this program is executed, the following pattern data in the OTA format is output.

PSET 0 0
SRA 60
RECT 1425 425 1575 575
RECT 1376 734 1526 884
RECT 1234 1013 1384 1163
RECT 1013 1234 1163 1384
RECT 734 1376 884 1526
RECT 425 1425 575 1575
SRA 90
RECT 2350 350 2650 650
RECT 2252 968 2552 1268
RECT 1968 1526 2268 1826
RECT 1526 1968 1826 2268
RECT 968 2252 1268 2552
RECT 350 2350 650 2650
SRA 120
RECT 3275 275 3725 725
RECT 3128 1202 3578 1652
RECT 2702 2038 3152 2488
RECT 2038 2702 2488 3152
RECT 1202 3128 1652 3578
RECT 275 3275 725 3725
SRA 150
RECT 4200 200 4800 800
RECT 4004 1436 4604 2036
RECT 3436 2551 4036 3151
RECT 2551 3436 3151 4036
RECT 1436 4004 2036 4604
RECT 200 4200 800 4800

The following description example 3 is an example of a pattern generation program that generates pattern data for drawing the pattern of FIG. 14.

Description Example 3 import fig
import math
DIV=5
def draw_fig(dsg, base_rank):
  def draw_rects(dsg, rad, size):
    for i in range(DIV+1):
      angle=(math.pi/(2*DIV))*i
      dsg.rect(rad, -angle, size, size, ref=fig.Refpos.C)
    for i in range (5): # Repeat from inside to outside radius
      dsg.shotrank(base_rank+(i+1)*30) # Change shot rank according to radius
      draw_rects(dsg, 1000*i, 150*i)
dsg=fig.OTADesigner( )
dsg.subfield(0, 0)
with dsg(fig.PolarCoordinate(500, 500)):
  draw_fig(dsg, 0)
dsg.subfield(3000, 3000) # Change subfield position
with dsg(fig.PolarCoordinate(3500, 3500)):
  draw_fig(dsg, 256) # Change reference value for shot rank
dsg.end( )

In this example, the statements of the second to fourth lines from the last are added to the description example 2, which adds the figure group (G2) at the lower right. The statement "dsg.subfield ( )" makes it possible to draw the additional figure group in a subfield independent of the upper left figure group (G1). Both the upper left figure group and the lower right figure group maintain the same relative positional relationship from their respective subfields.

The following description example 4 is an example of a pattern generation program that generates pattern data for drawing the pattern of FIG. 15.

Description Example 4 import fig
dsg=fig.OTADesigner( )
dsg.subfield(0, 0)
dsg.shotrank(500)
fig.donut(dsg, 1000, 1000, 1000, 500, 16)
dsg.end( )

In this example, the code is very short because the output function "fig.donut( )" of the donut-shaped figure defined in an auxiliary library is used. When this program is executed, the following 139 commands are output as pattern data in the OTA format.

PSET 0 0
SRA 500
TRAPX 1497 950 1998 2000 1500 1000
TRAPX 1490 901 1995 1998 1497 950
TRAPX 1477 853 1989 1995 1490 901
TRAPX 1460 804 1980 1989 1477 853
TRAPX 1436 757 1970 1980 1460 804
TRAPX 1407 709 1956 1970 1436 757
TRAPX 1369 663 1941 1956 1407 709
TRAPX 1353 646 1935 1941 1369 663
TRAPX 1382 617 1923 1935 1353 646
TRAPX 1427 572 1903 1923 1382 617
TRAPX 1471 528 1881 1903 1427 572
TRAPX 1514 485 1857 1881 1471 528
TRAPX 1555 444 1831 1857 1514 485
TRAPX 1595 404 1803 1831 1555 444
TRAPX 1634 365 1773 1803 1595 404
TRAPX 1671 328 1740 1773 1634 365
TRAPX 1707 292 1707 1740 1671 328
——Omitted——
TRAPX 1436 1242 1970 1956 1407 1290
TRAPX 1460 1195 1980 1970 1436 1242
TRAPX 1477 1146 1989 1980 1460 1195
TRAPX 1490 1098 1995 1989 1477 1146
TRAPX 1497 1049 1998 1995 1490 1098
TRAPX 1500 1000 2000 1998 1497 1049

Figure 16:
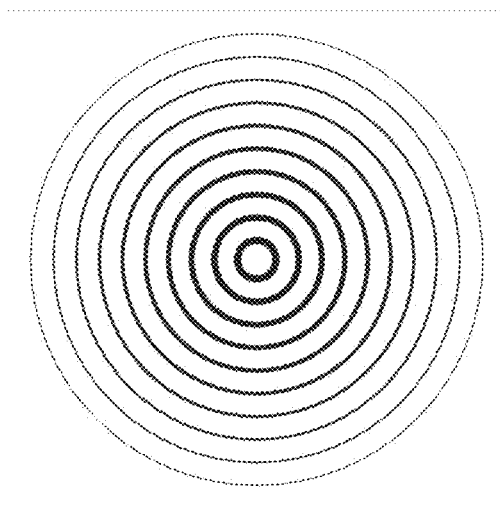
FIG. 16 illustrates an example of a pattern of concentric circles.

The following description example 5 is an example of a pattern generation program that generates pattern data for drawing a pattern of concentric circles as illustrated in FIG. 16. The concentric circles are composed of 10 circles, and the shot time for and the line width of each circle change according to the distance from the center.

Description Example 5 import fig
N_CIRCLE=10
dsg=fig.OTADesigner( )
dsg.subfield(100, 100)
for i in range(N_CIRCLE):
   outer_r=100*(i+1)
   inner_r=outer_r−(N_CIRCLE−i)*3
   dsg.shotrank(15*i+90)
   fig.donut(dsg, 1000, 1000, outer_r, inner_r, 8)
dsg.end( )

This short code outputs 732 commands. Note that the description of the pattern data output by this program being executed is omitted here.

As described above, according to the electron beam drawing device of the present embodiment, the pattern data (60, 61) may be dynamically generated at the time of drawing by the pattern generation program instead of using the static pattern data (31). This makes it possible to reduce the occupied space of the disk for the pattern data. In addition, without using the data conversion software 22, a pattern generation program may be described to directly output subfield position, shot rank (shot time), and figures. This makes it possible to ensure the characteristics for a prototype device that draws and creates a pattern. Further, the pattern generation program may be described in a general-purpose interpreted language such as Python. This makes it possible to easily prepare a test sample in which the conditions are changed and thus to shorten the time required for retrying trials and errors. As described above, according to the electron beam drawing device of the present embodiment, it is possible to provide efficient production of a prototype device, particularly in the field of research and development of optical devices and nanotechnology.

Further, the electron beam drawing device of the present embodiment can use a combination of pattern data into which CAD data is converted and pattern data generated by the pattern generation program. For example, the electron beam drawing device may have a selective function of using the pattern generation program to draw a figure having a special shape (circle, one defined in polar coordinates, spiral shape, etc.) or a figure group in which the order of drawing figures is secured, and using pattern data into which CAD data is converted to draw figures of other general shapes (squares, etc.).

Figure 17:
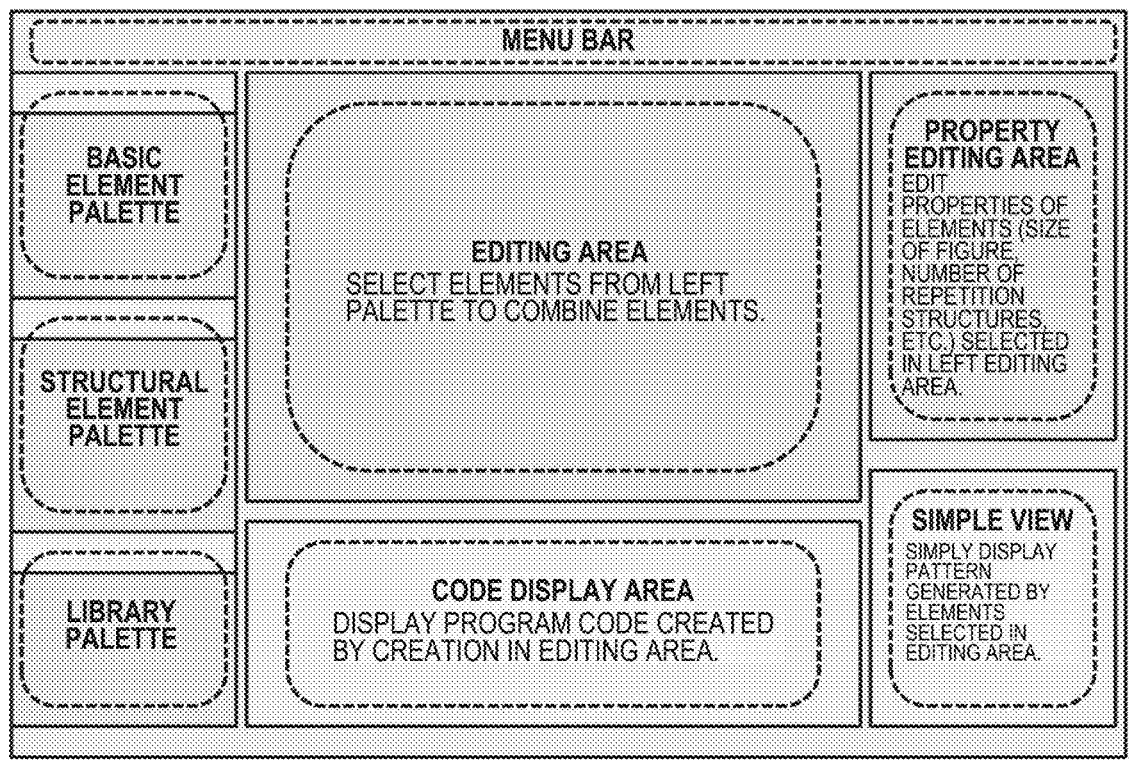
FIG. 17 illustrates an example of the screen layout of an editor.

The pattern generation program can be created by a user using an editor (software) available on the control device 40 (or another computer). FIG. 17 illustrates an example of the screen layout of an editor for creating a pattern generation program. As illustrated in FIG. 17, a basic element palette, a structural element palette, and a library palette are arranged on the left side of the GUI of the editor. In the basic element palette, options of basic elements that define the type (shape) of a figure are displayed. In the structural element palette, options of structural elements that define the regular arrangement of the figure are displayed. In the library palette, auxiliary libraries are displayed. Further, an editing area and a code display area are arranged in the center of the GUI. The editing area is an area for arranging a combination (visual combination) of elements selected from each palette on the left side. In the code display area, the pattern generation program generated by the editor is displayed. Further, a property editing area and a simple view are arranged on the right side of the GUI. The property editing area is an area for setting (editing) the property of the elements selected in the editing area. In the simple view, a pattern generated by the elements selected in the editing area is simply displayed.

Figure 18:
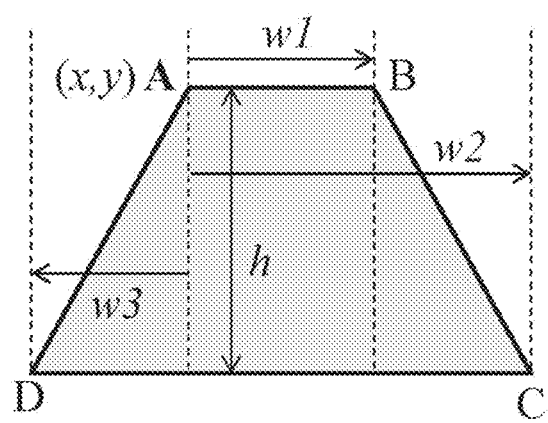
FIG. 18 is a diagram for explaining the parameters of an x-trapezoid.
Figure 19:
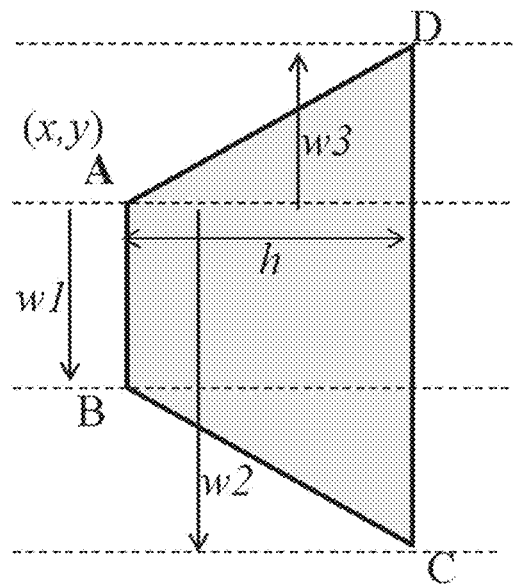
FIG. 19 is a diagram for explaining the parameters of a y-trapezoid.
Figure 20:
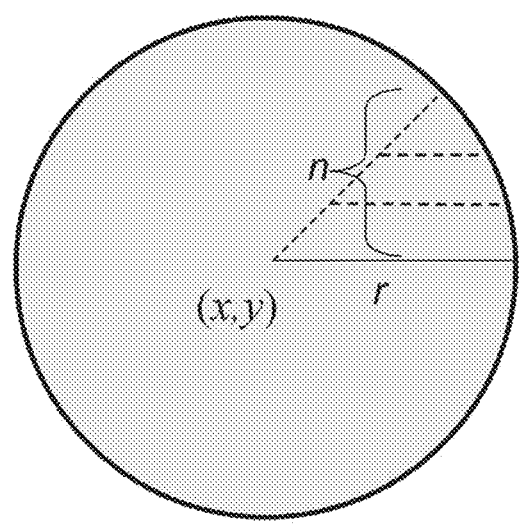
FIG. 20 is a diagram for explaining the parameters of a circle.

The basic elements are prepared including rectangle, x-trapezoid, y-trapezoid, circle, annulus, shot rank, and subfield. The rectangle is a rectangle whose sides are parallel to the x-axis and the y-axis, and has four parameters: the coordinates (x, y) of the upper left vertex, a width (w), and a height (h). As illustrated in FIG. 18, the x-trapezoid is a trapezoid whose upper base is parallel to the x-axis, and has six parameters: the coordinates (x, y) of the left end (A) of the upper side, a height (h) with reference to A, an offset (w1) to the right end (B) of the upper side, and an offset (w2, w3) to both ends (C, D) of the base. The parameters w2 and w3 are directional. For example, since D in FIG. 18 is on the left side from A, w3 has a negative value. As illustrated in FIG. 19, the y-trapezoid is a trapezoid whose upper base is parallel to the y-axis, and has six parameters: the coordinates (x, y) of the upper end (A) of the upper side, a height (h) with reference to A, an offset (w1) to the lower end (B) of the upper side, and an offset (w2, w3) to both ends (C, D) of the base. The parameters w2 and w3 are directional. For example, since D in FIG. 19 is on the upper side from A, the parameter w3 has a negative value. The circle is not a figure that can be directly handled by the electron beam drawing device, but is approximately represented by a plurality of trapezoids. As illustrated in FIG. 20, the circle has four parameters: the center coordinates (x, y), a radius (r), and the number of divisions (n) of an octant. The annulus is also approximately represented by a plurality of trapezoids like the circle. While the circle has a single radius (r), the annulus has five parameters: two radii (r1, r2) for the inner circumference and the outer circumference, respectively, the center coordinates (x, y), and the number of divisions (n) of an octant. The shot rank has a shot rank number as a parameter. The subfield is an element that defines the base point of a subfield section, and has the coordinates (x, y) of the left end of the section as parameters.

Figure 21:
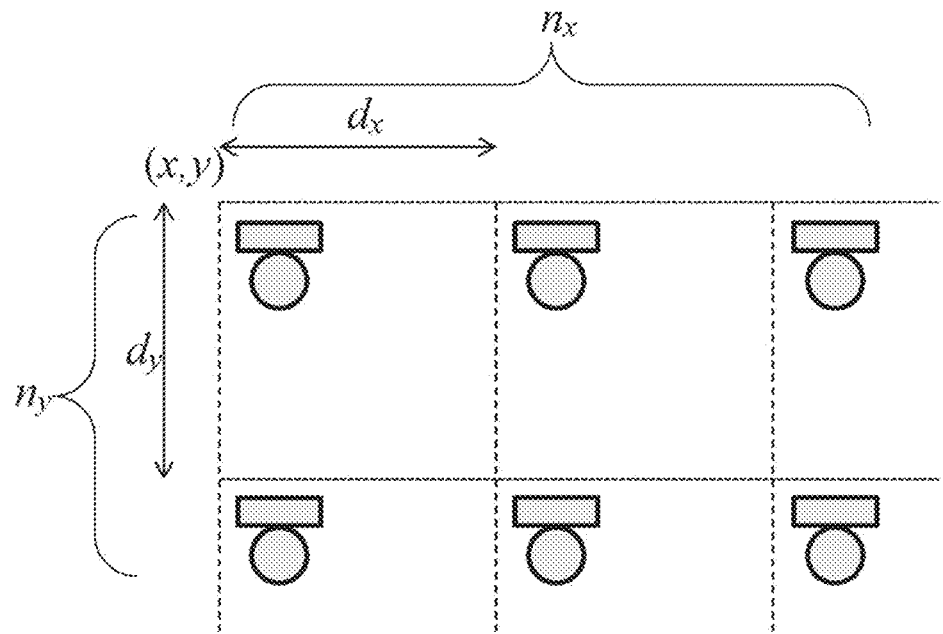
FIG. 21 is a diagram for explaining the input parameters of an orthogonal arrangement.
Figure 22:
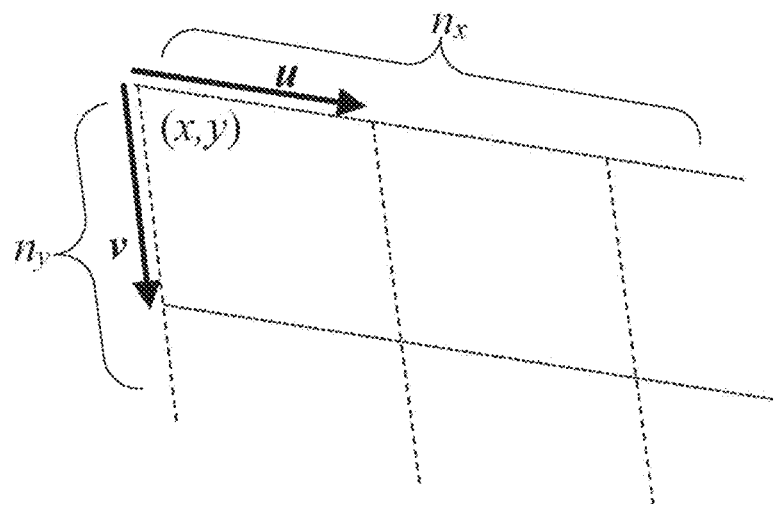
FIG. 22 is a diagram for explaining the input parameters of an oblique arrangement.
Figure 23:
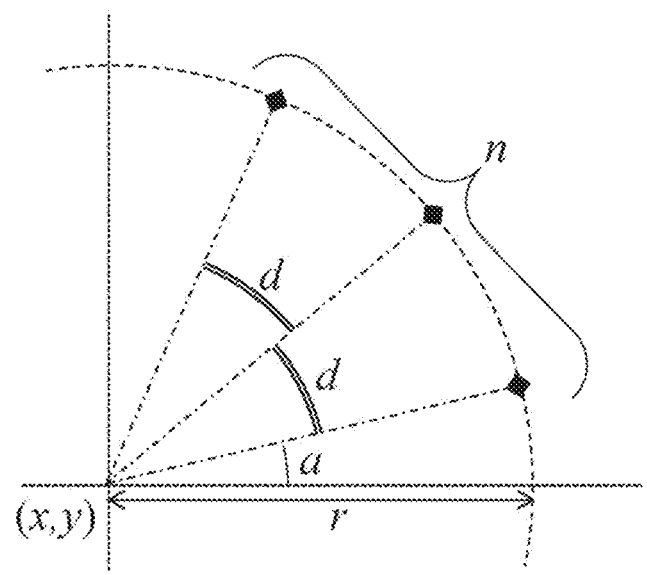
FIG. 23 is a diagram for explaining the input parameters of a circumferential arrangement.

The structural elements are primarily used to regularly arrange the basic elements, and are each a mechanism that generate output parameters multiple times (a sequence of output parameters) from input parameters. The structural elements are prepared including, orthogonal arrangement, oblique arrangement, circumferential arrangement, generator, group, and step. As illustrated in FIG. 21, the orthogonal arrangement is a structural element indicating an arrangement in a grid parallel to the x-axis and the y-axis, has as input parameters six parameters: the origin coordinates (x, y), x- and y-direction pitches ($d_x$, $d_y$), x- and y-direction repetitions ($n_x$, $n_y$), and has as output parameters coordinates (X, Y) and x- and y-direction repetition indexes ($I_x$, $I_y$). The oblique arrangement is a structural element indicating a generalized orthogonal arrangement, uses vectors (u, v) (see FIG. 22) instead of $d_x$ and $d_y$, and X and Y are calculated by vector operation. The oblique arrangement has input parameters (x, y, u, v, $n_x$, $n_y$), which are actually eight input parameters taking into consideration the fact that vector is two-dimensional. The orthogonal arrangement can be said to be a special case of u=($d_x$, 0) and v=(0, $d_y$). In FIG. 23, the circumferential arrangement is a structural element indicating an arrangement at equal intervals on a circumference, has as input parameters six parameters: the center coordinates (x, y), a radius (r), an initial angle (a), an incremental angle (d), and the number of points (n), and has coordinates (X, Y) and an arc direction repetition index (I) as output parameters. The generator is a structural element for generating a new repetition structure having any input and output parameters by directly defining a script for a generator function in the Python language. Using this structural element makes it possible to generate advanced patterns such as arranging figures on any mathematical curves. The group is a structural element indicating an orthogonal arrangement with the number of repetitions ($n_x$, $n_y$) for $n_x$=$n_y$=1. In this case, the pitches ($d_x$, $d_y$) have no meaning. This structural element is used for the purpose of simplifying the arrangement of a plurality of figures. The step is a structural element for outputting an arithmetic progression from input parameters, and is a tool for generating a more complicated structure in combination with other structural element instead of generating coordinates. For example, associating the output parameters of the step with the radius parameter (r) of the circumferential arrangement makes it possible to provide repetition in the radial direction, which makes a concentric structure.

Figure 24:
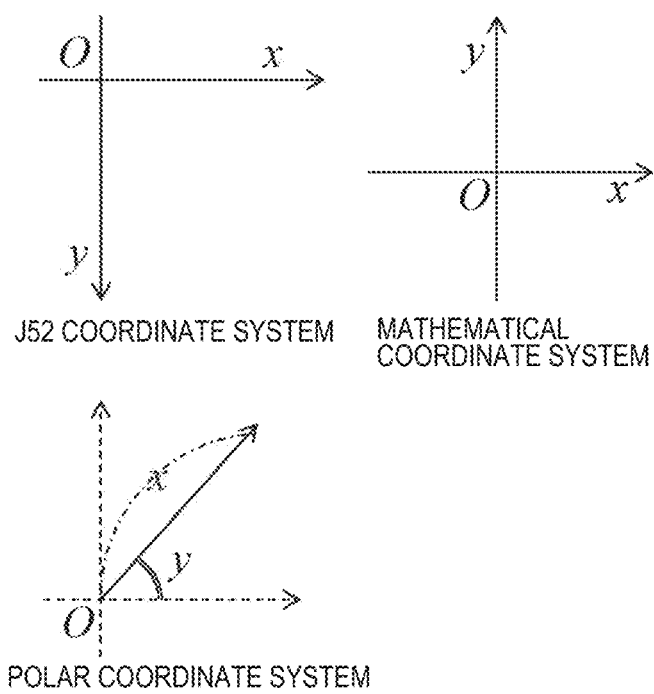
FIG. 24 is a diagram for explaining a coordinate system.

Most of the basic elements and the structural elements have reference positions (x, y) as parameters. The reference position depends on the currently enabled coordinate system. There are three types of coordinate systems illustrated in FIG. 24, and the standard is the J52 coordinate system. The coordinate system is relative and have no absolute origin or direction. For both a basic element and a structural element, the meaning of the position (x, y) follows the coordinate system specified by the element to which it belongs. A coordinate system that depends on this context is referred to as a local coordinate system or a current coordinate system. The top level is the J52 coordinate system with the upper left of the drawing material M being the origin. For the structural elements other than the step, a coordinate system with output parameters (X, Y) being the origin is set in the repeating units. The type of coordinate system is specified in the property of the structural element.

Editing Example A

Next, an editing example to create a pattern generation program using an editor will be described. An editing example A is an example of creating a pattern generation program for drawing a pattern illustrated in FIG. 25 (a figure group in which three rectangles and three circles are arranged at equal intervals on the circumference).

Figure 26:
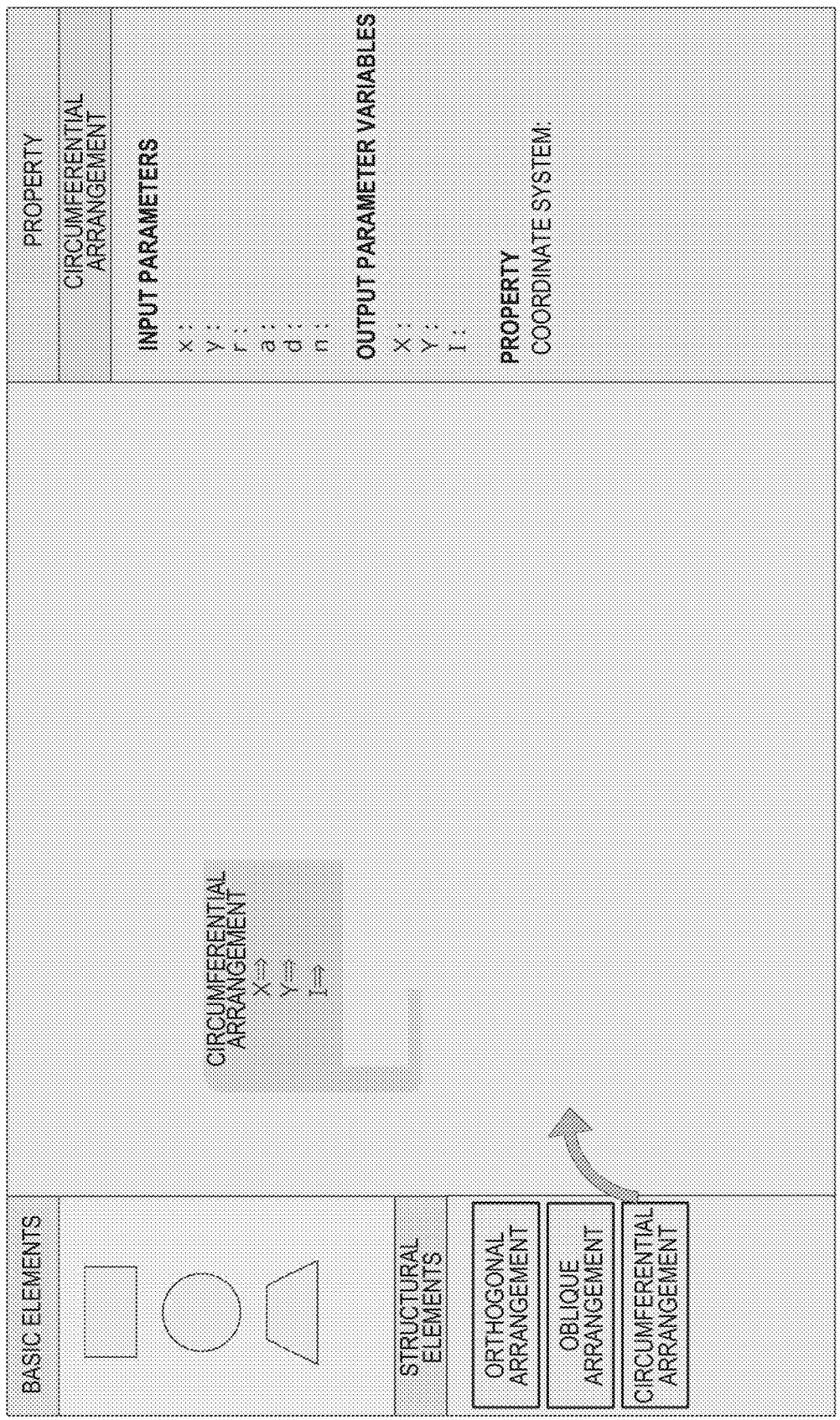
FIG. 26 illustrates an operation in the editing example A.

In an example illustrated in FIG. 26, "rectangle", "circle", and "x-trapezoid" are displayed as options of basic elements in the basic element palette of the editor, and "orthogonal arrangement", "oblique arrangement", and "circumferential arrangement" are displayed as options of structural elements in the structural element palette. In FIG. 26, the library palette, the code display area, and the simple view are omitted. First, the user drags and drops the "circumferential arrangement" icon from the structural element palette to the editing area. Then, a C-shaped block is displayed in the editing area, and the input parameters (x, y, r, a, d, n) and output parameters (X, Y, I) of the circumferential arrangement and the property (coordinate system) are displayed in the property editing area. "X→ . . . " displayed in that block is synchronized with the variable setting of the output parameters in the property editing area, but it is not used in this example.

Figure 27:
FIG. 27 illustrates an operation in the editing example A.

Next, as illustrated in FIG. 27, the user sets values for the input parameters of the circumferential arrangement in the property editing area, and selects and sets "mathematical coordinate system" as the coordinate system for the property.

Figure 28:
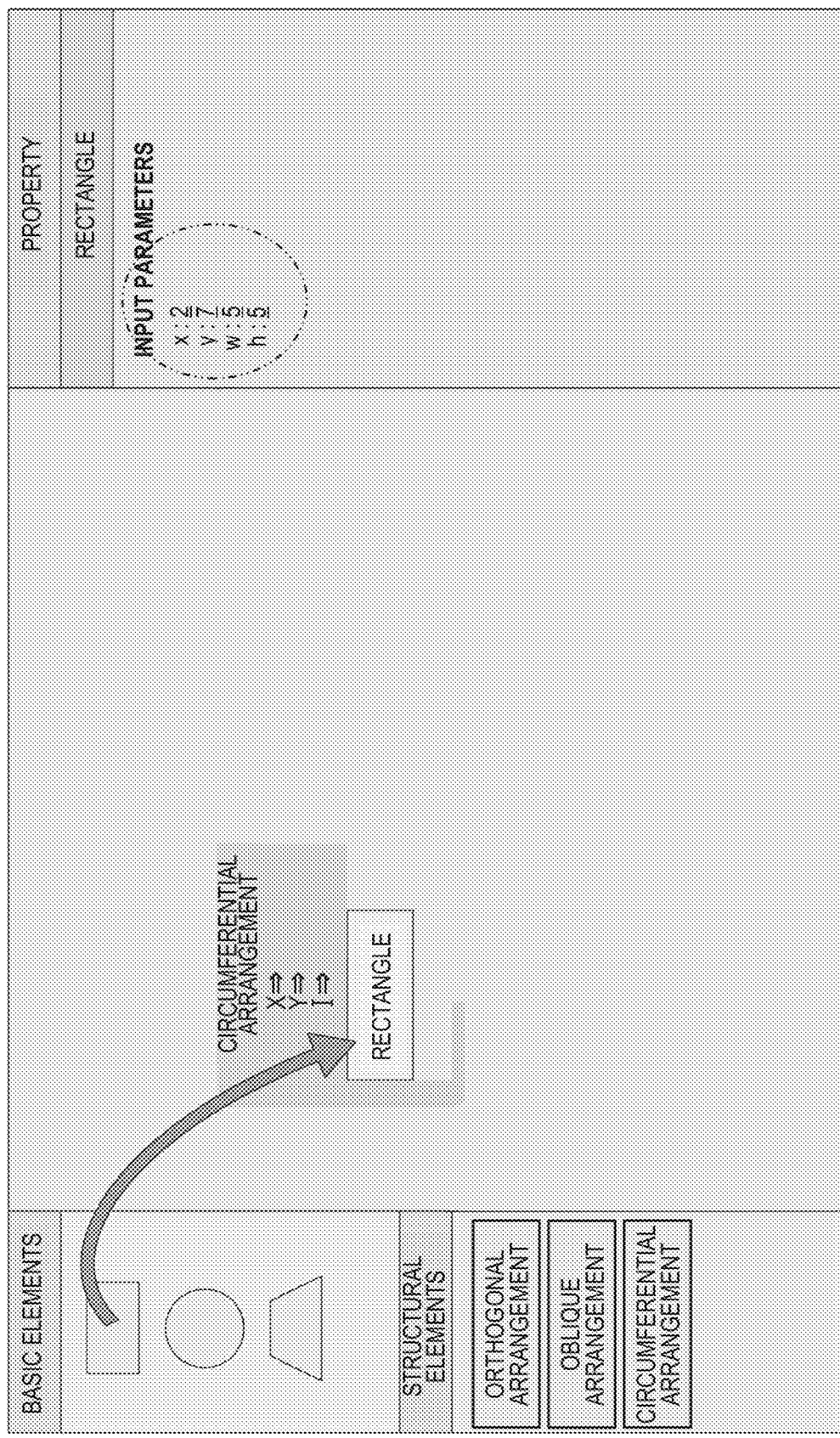
FIG. 28 illustrates an operation in the editing example A.

Next, as illustrated in FIG. 28, the user drags and drops the "rectangle" icon from the basic element palette to the "circumferential arrangement" block (C-shaped part) arranged in the editing area (performs the operation of combining the basic element, "rectangle" with the structural element, "circumferential arrangement"). Then, a "rectangular" block combined with the "circumferential arrangement" block is displayed in the editing area, and the input parameters (x, y, w, h) of the rectangular are displayed in the property editing area. Next, the user sets values for the input parameters of the rectangular in the property editing area.

Figure 25:
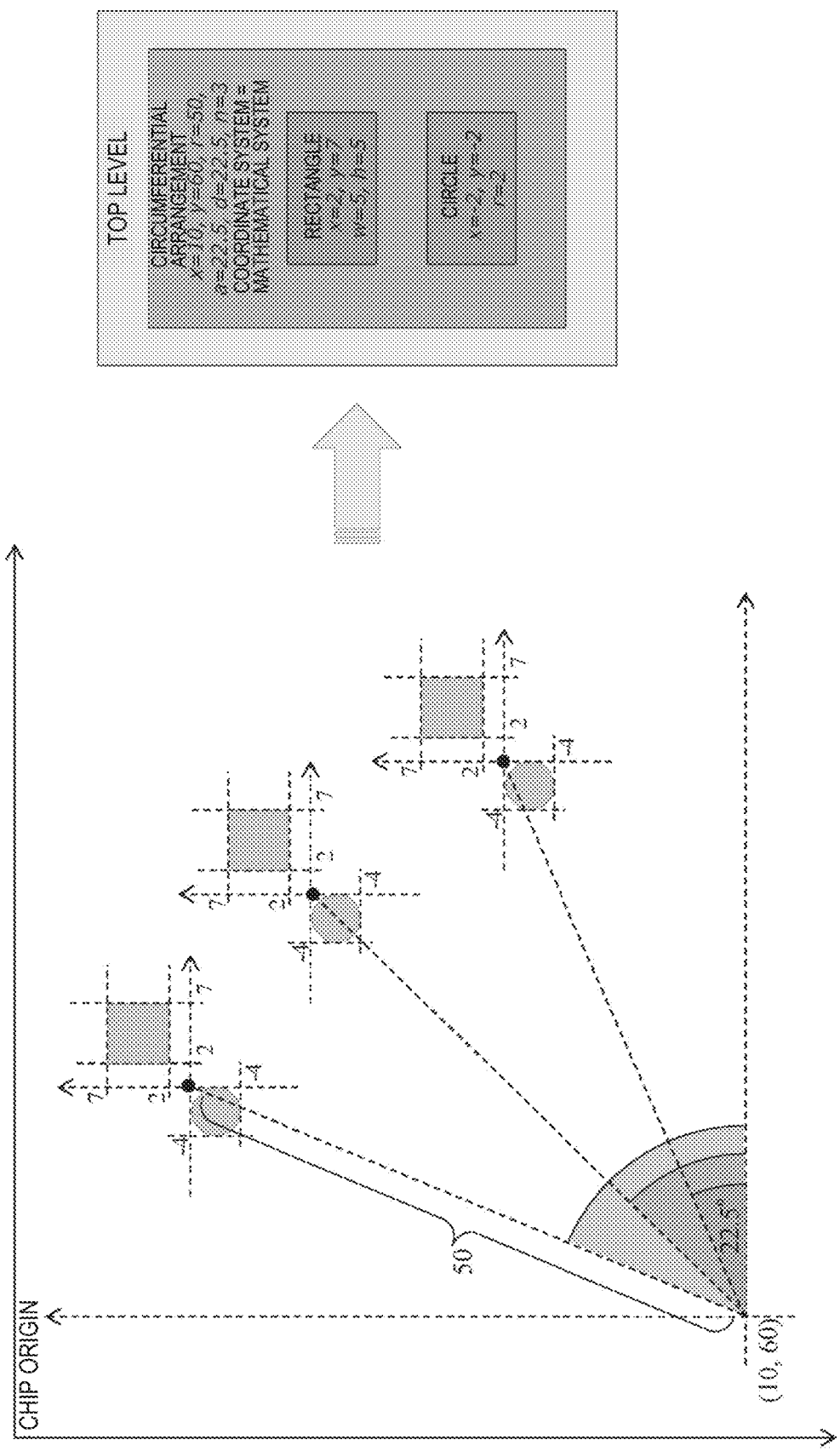
FIG. 25 illustrates a pattern in an editing example A.
Figure 29:
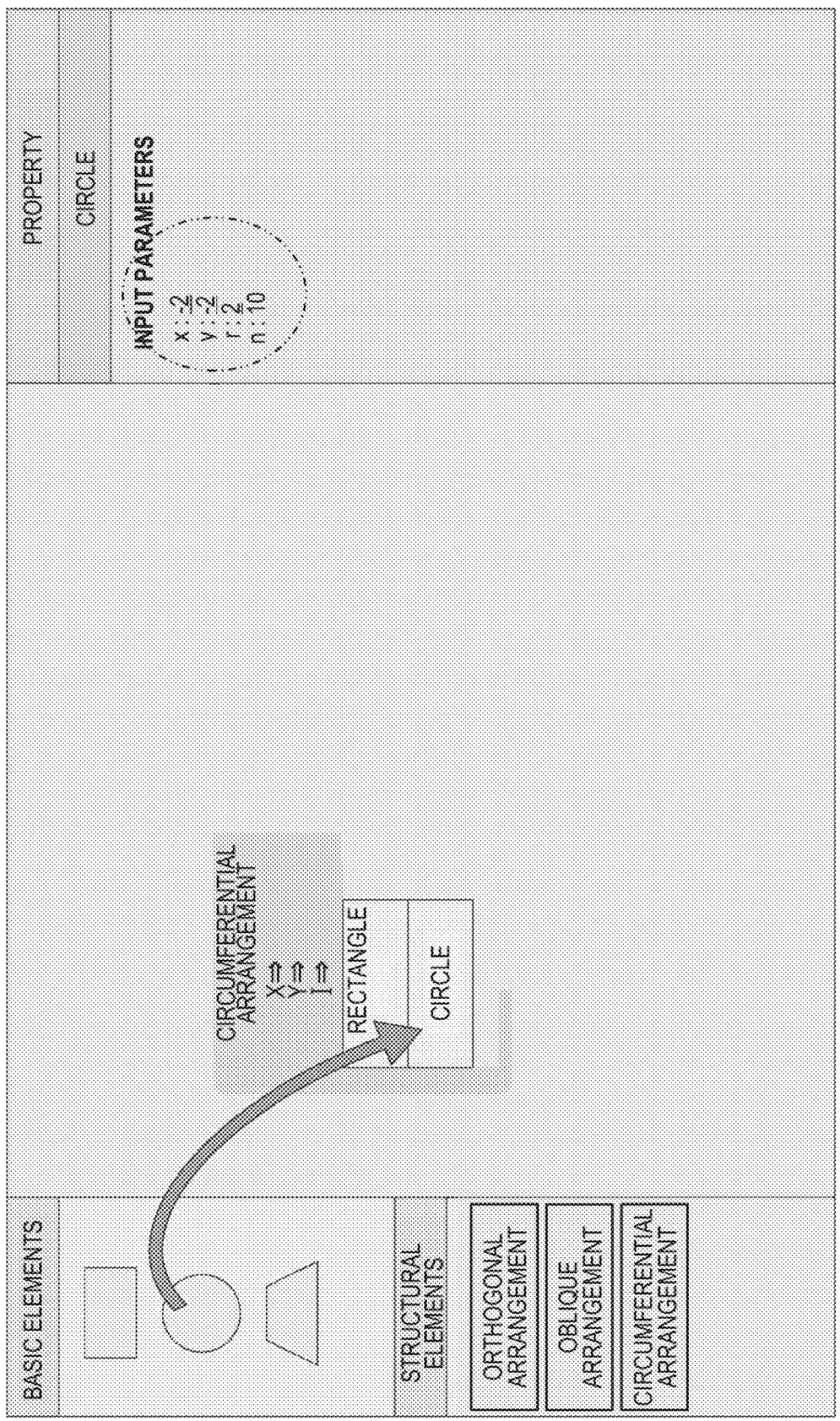
FIG. 29 illustrates an operation in the editing example A.

Next, as illustrated in FIG. 29, the user drags and drops the "circle" icon from the basic element palette to the "circumferential arrangement" block arranged in the editing area (performs the operation of combining the basic element, "circle" with the structural element, "circumferential arrangement"). Then, a "circle" block combined with the "circumferential arrangement" block is displayed in the editing area, and the input parameters (x, y, r, n) of the circle are displayed in the property editing area. Next, the user sets values for the input parameters of the circle in the property editing area. By the editing operation as described above, a pattern generation program for generating pattern data for drawing the pattern illustrated in FIG. 25 is created.

Editing Example B

Figure 30:
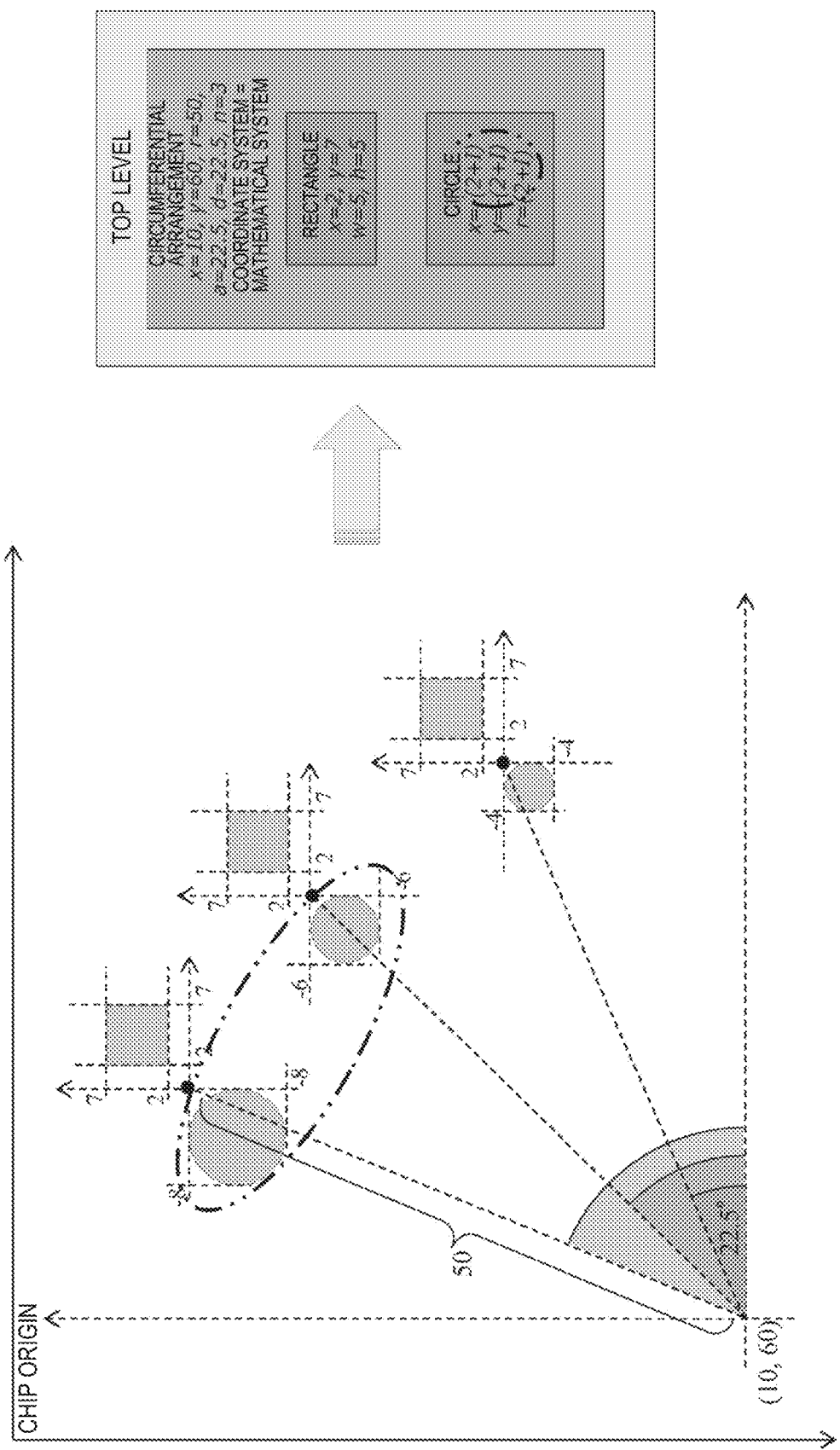
FIG. 30 illustrates a pattern in an editing example B.

In the editing example A, the input parameters of each figure are fixed values, while in an editing example B, circles have a radius increased by the repetition index (output parameter I) as illustrated in FIG. 30. The combination of a structural element and basic elements is also displayed in the same way, except that expressions with variable names are set for the parameters of the circle instead of their immediate values. Hereinafter, the differences from the editing example A will be mainly described.

Figure 31:
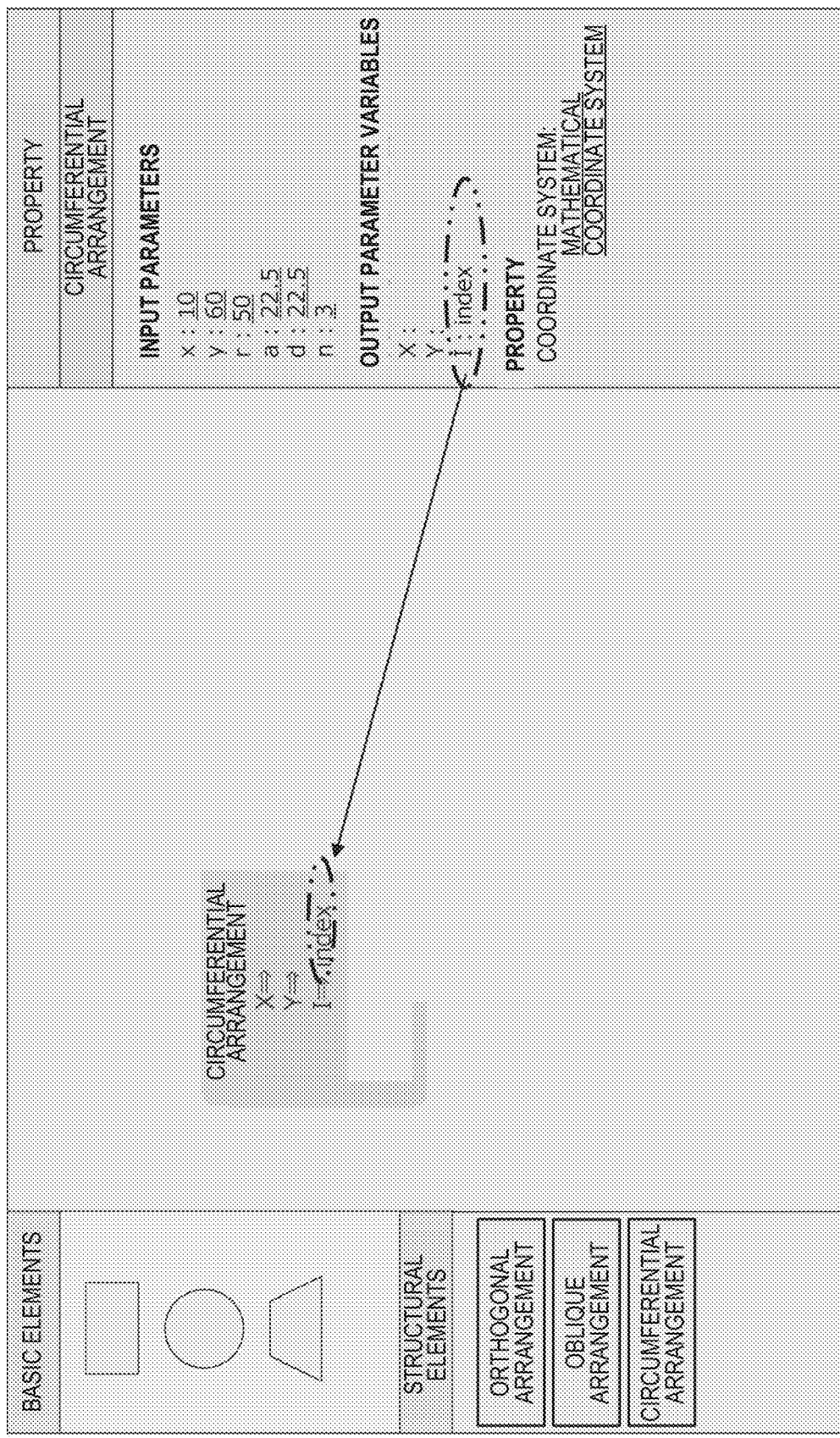
FIG. 31 illustrates an operation in the editing example B.

As illustrated in FIG. 31, after displaying a "circumferential arrangement" block in the editing area, the user sets values for the input parameters of the circumferential arrangement in the property editing area, and selects and sets "mathematical coordinate system" as the coordinate system for the property. The user also assigns a variable name to the parameter name "I" among the output parameters of the circumferential arrangement. Here, the variable name is "index". Then, "index" is displayed after "I→" displayed in the "circumferential arrangement" block.

Figure 32:
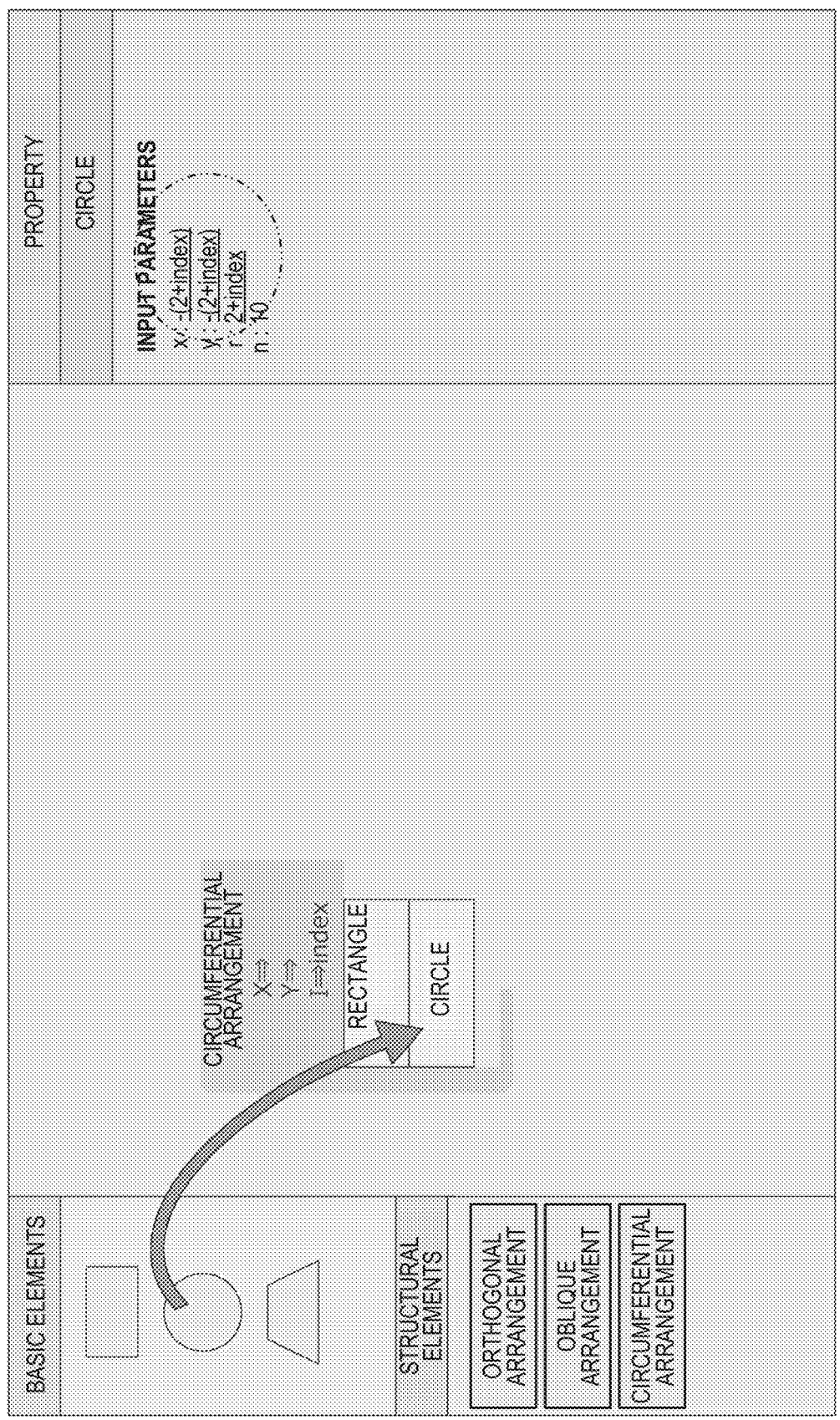
FIG. 32 illustrates an operation in the editing example B.

As illustrated in FIG. 32, the user drags and drops the "circle" icon from the basic element palette to the "circumferential arrangement" block arranged in the editing area to display a "circle" block combined with the "circumferential arrangement" block, and then sets values for the input parameters of the circle in the property editing area. At this time, the variable name "index" assigned to the output parameter of the circumferential arrangement is used to set values for the input parameters (x, y, r) of the circle. Note that the output parameter name "I" is not used because the output parameter names conflict when the structural elements are nested. By the editing operation as described above, a pattern generation program for generating pattern data for drawing the pattern illustrated in FIG. 30 is created.

In this way, it is possible to create a pattern generation program for drawing a pattern in which figures are regularly arranged through an intuitive and easy-to-understand operation of selecting a basic element or basic elements and a structural element to combine the selected basic and structural elements, and thus to improve user convenience.

Note that the invention is not limited to the above-described embodiments, and various modifications are possible. The invention includes configurations that are substantially the same (for example, in function, method, and results, or in objective and effects) as the configurations described in the embodiments. The invention also includes configurations in which non-essential elements described in the embodiments are replaced by other elements. The invention also includes configurations having the same effects as those of the configurations described in the embodiments, or configurations capable of achieving the same objectives as those of the configurations described in the embodiments.

The invention further includes configurations obtained by adding known art to the configurations described in the embodiments.

Some embodiments of the invention have been described in detail above, but a person skilled in the art will readily appreciate that various modifications can be made from the embodiments without materially departing from the novel teachings and effects of the invention. Accordingly, all such modifications are assumed to be included in the scope of the invention.

What is claimed is:

1. A charged particle beam drawing device comprising:
   a storage unit that stores a pattern generation program for generating pattern data, the pattern generation program being a program in which an instruction for specifying a type of a figure and an instruction for specifying a regular arrangement of the figure are described;
   an execution unit that executes the pattern generation program stored in the storage unit; and
   a control unit that performs drawing control based on the pattern data generated by the executed pattern generation program,
   wherein the storage unit stores pattern data generated by converting figure data, wherein the pattern data generated by converting figure data is not generated by the pattern generation program, and
   the control unit performs drawing control based on the pattern data stored in the storage unit and the pattern data generated by the pattern generation program.

2. The charged particle beam drawing device according to claim 1, further comprising:
   a display control unit that displays on a display unit a plurality of options of basic elements that define the type of the figure and a plurality of options of structural elements that define the regular arrangement of the figure;
   an operation reception unit that receives a user operation for making selection from among the basic elements and the structural elements to combine the selected basic and structural elements; and
   a program creation unit that creates the pattern generation program based on a combination of the basic elements and the structural elements selected in the operation.

3. A method of controlling a charged particle beam drawing device, the method comprising:
   a storage step of storing in a storage unit a pattern generation program for generating pattern data and pattern data generated by converting figure data, wherein the pattern data generated by converting figure data is not generated by the pattern generation program, the pattern generation program being a program in which an instruction for specifying a type of a figure and an instruction for specifying a regular arrangement of the figure are described;
   an execution step of executing the pattern generation program stored in the storage unit; and
   a control step of performing drawing control based on the pattern data stored in the storage unit and the pattern data generated by the executed pattern generation program.

* * * * *